(12) United States Patent
Jones et al.

(10) Patent No.: US 9,281,434 B2
(45) Date of Patent: Mar. 8, 2016

(54) INFRA RED DETECTORS AND A METHOD OF MANUFACTURING INFRA RED DETECTORS USING MOVPE

(75) Inventors: Christopher Jones, Basildon (GB); Sudesh Bains, Basildon (GB)

(73) Assignee: SELEX ES LTD, Essex (GB)

( * ) Notice: Subject to any disclaimer, the term of this patent is extended or adjusted under 35 U.S.C. 154(b) by 0 days.

(21) Appl. No.: 13/512,836

(22) PCT Filed: Nov. 2, 2010

(86) PCT No.: PCT/EP2010/066643
§ 371 (c)(1),
(2), (4) Date: May 30, 2012

(87) PCT Pub. No.: WO2011/067058
PCT Pub. Date: Jun. 9, 2011

(65) Prior Publication Data
US 2012/0235262 A1  Sep. 20, 2012

(30) Foreign Application Priority Data

Dec. 1, 2009 (GB) .................................. 0921053.5

(51) Int. Cl.
*H01L 31/103* (2006.01)
*H01L 27/146* (2006.01)
*H01L 31/0296* (2006.01)

(52) U.S. Cl.
CPC ........ *H01L 31/1032* (2013.01); *H01L 27/1465* (2013.01); *H01L 27/14649* (2013.01); *H01L 31/0296* (2013.01)

(58) Field of Classification Search
CPC .................. H01L 27/1465; H01L 31/1032
See application file for complete search history.

(56) References Cited

U.S. PATENT DOCUMENTS

| 5,751,049 | A | 5/1998 | Goodwin | |
|---|---|---|---|---|
| 5,838,053 | A | 11/1998 | Bevan et al. | |
| 5,989,933 | A | 11/1999 | Bevan et al. | |
| 6,180,967 | B1 * | 1/2001 | Zanatta et al. | 257/184 |
| 2007/0197022 | A1 | 8/2007 | Hails et al. | |
| 2008/0217539 | A1 * | 9/2008 | Talghader | 250/340 |

OTHER PUBLICATIONS

International Search Report (PCT/ISA/210) issued on Jan. 20, 2011, by the European Patent Office as the International Searching Authority for International Application No. PCT/EP2010/066643.
Written Opinion (PCT/ISA/237) issued on Jan. 20, 2011, by the European Patent Office as the International Searching Authority for International Application No. PCT/EP2010/066643.

* cited by examiner

*Primary Examiner* — Thanh V Pham
(74) *Attorney, Agent, or Firm* — Buchanan Ingersoll & Rooney PC

(57) ABSTRACT

A method of forming infra red detector arrays is described, starting with the manufacture of a wafer. The wafer is formed from a GaAs or GaAs/Si substrate having CMT deposited thereon by MOVPE. The CMT deposited can include a number of layers of differing composition, the composition being controlled during the MOVPE process and being dependent on the thickness of the layer deposited. A CdTe buffer layer can aid deposition of the CMT on the substrate. Once the wafer is formed, the buffer layer, an etch stop layer and any intervening layers can be etched away leaving a wafer suitable for further processing into an infra red detector.

8 Claims, 1 Drawing Sheet

Figure 1
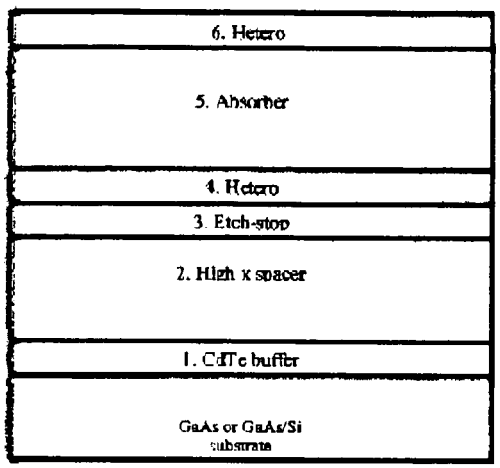
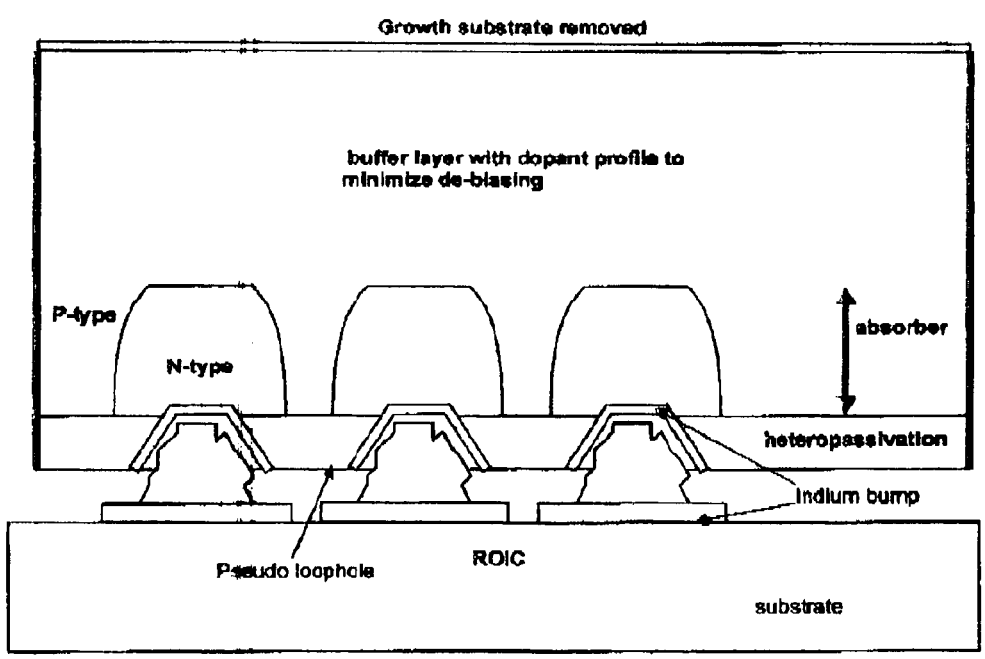
FIGURE 2

INFRA RED DETECTORS AND A METHOD OF MANUFACTURING INFRA RED DETECTORS USING MOVPE

The invention relates to infra red detectors and methods of manufacture. More specifically but not exclusively it relates to a method of manufacturing infra red focal plane arrays by forming a diode matrix in epitaxial layers of cadmium mercury telluride (CMT) that have precisely controlled doping and composition profiles, such that device performance is maximised and device fabrication cost is minimised. In particular, low cost GaAs and GaAs on silicon growth substrates can be utilised enabling infra red detectors of larger area and smaller pitch to be economically realised than that possible with alternative technologies. The x-ratio and dopant concentrations of the constituent epitaxial layers can be chosen so as to simplify the subsequent device fabrication process Infra red focal plane arrays can be constructed by ion beam milling an array of vias into a thin monolith of p-type CMT bonded onto a silicon read-out integrated circuit (ROIC). These have become known by the names of loophole or VIP (vertically integrated photodiode) focal plane arrays. The process for making loophole focal plane arrays currently utilises cadmium mercury telluride layers grown by liquid phase epitaxy (LPE).

This involves the following process steps:
1. Growth of CMT layer of ~30 μm thickness on a cadmium zinc telluride (CZT) substrate.
2. Removal of ~10 μm of CMT from the top surface by a combination of mechanical and chemical-mechanical polishing steps.
3. Deposition of a passivation layer (e.g. zinc sulphide) onto the top surface of the CMT.
4. Mounting the layer upside down onto a temporary substrate.
5. Removal of the CZT substrate by a selective etch.
6. Removal of ~10 μm of CMT from the CMT/CZT interface by a combination of mechanical and chemical-mechanical polishing steps.
7. Deposition of a passivation layer onto the CMT surface.
8. Defining monoliths into the CMT layer with a combination of photolithography and etching techniques.
9. Removal of the monoliths from the carrier substrate by dissolution of the intervening adhesive layer.
10. Bonding of the CMT monoliths onto the silicon ROIC.
11. Formation of an array of loophole diodes in the monoliths by a combination of photolithography and ion beam milling and contact metal deposition. The diodes are formed because the act of milling the loopholes (or vias) converts a cylinder of the CMT around each loophole from p-type to n-type, thus forming a pn junction.

It is a disadvantage of the above method that expensive CdZnTe growth substrate is used. Furthermore, expensive and complicated device fabrication procedures are used as the active device layers are separated from the growth substrate and mounted onto a temporary substrate.

Another disadvantage is that the passivation is applied after thinning the CMT and needs very careful process control to ensure there is no leakage path between diodes.

The above process disadvantageously requires the CMT detector material to be thinned into "monoliths" of thickness <~10 um. This increases fabrication costs due to yield losses arising from monolith breakage and limits the smallest array pitch and the largest array area that can be realised.

The VIP FPA process has the additional complication of requiring the passivated monoliths to be mounted onto a sacrificial substrate prior to bonding onto the ROIC.

According to the invention there is provided. a method of producing an infrared detector comprising the step of forming diodes in a CMT heterostructure that is comprised of a series of layers of precisely controlled composition and doping.

In this way, the invention overcomes the disadvantages associated with previously used methods.

The invention will now be described with reference to the accompanying diagrammatic drawings in which:

FIG. 1 is a schematic drawing showing a proposed structure of a wafer manufactured using an MOVPE technique in accordance with one form of the invention prior to processing into an infra red detector array; and FIG. 2 is a schematic drawing showing a second form of the invention after processing into an infrared detector array.

In one form of the invention, loophole focal plane arrays are manufactured from wafers made using CMT layers grown by metal-organic vapour-phase epitaxy (MOVPE) on gallium arsenide (GaAs) or gallium arsenide buffered silicon (GaAs: Si) substrates. The MOVPE technique allows the composition of the CMT (i.e. the value of x in $Cd_xHg_{1-x}Te$) and the n-type and p-type dopant levels to be independently and precisely controlled as a function of layer thickness, enabling the electrical performance of the device to be optimised.

Using the MOVPE technique, a wafer shown in FIG. 1 is produced and is subsequently processed as described below to form the required infra red device. As shown in FIG. 1, the wafer produced by MOVPE comprises the active device layers consisting of a p-type photon absorbing layer 5 sandwiched between layers 4 and 6 which have a higher Cd to Hg ratio; i.e. a higher value of x(Cd) in $Cd_xHg_{1-x}Te$. These higher x(Cd) layers will act as passivation for the pn junction when it is formed, and are referred to as hetero-passivation layers. Layer 1 in the structure shown is a cadmium telluride (CdTe) buffer which is required to accommodate lattice mismatch between a growth substrate and the CMT epitaxial layer. Layer 2 positions the active device layers 4, 5 and 6 away from the region of poorer crystallinity near the substrate growth interface. Layer 3 is an optional etch stop layer which enables the substrate and layers 1 and 2 to be removed by chemical etching while leaving the active layers intact.

Since the hetero-passivation layers 4, 6 are formed during MOVPE growth, the device fabrication procedure is greatly simplified. The subsequent steps required to manufacture a device can be summarised as follows:
1. MOVPE growth of the structure shown in FIG. 1.
2. Dice the CMT wafer into individual die.
3. Bond die to tested good sites on ROIC wafer.
4. Remove the substrate and layers 1 to 3 by selective etching.
5. Formation of an array of loophole diodes in the monoliths by a combination of photolithography and ion beam milling and contact metal deposition.
6. Dice ROIC wafer into individual die.

There are many advantages of making loophole arrays with MOVPE layers of the above design. Firstly GaAs and GaAs/Si substrates are available in a larger area than the CZT substrates required for LPE growth. GaAs and GaAs/Si substrates are also cheaper that CZT substrates. Secondly, the etch stop layer enables the removal of the buffer layer by chemical etching in a way that guarantees the final device will have a uniform thickness.

Furthermore, it is a further advantage of the technique that the need to mount the active device layers on a temporary sacrificial substrate is eliminated. Moreover, the handling and gluing of fragile ~10 μm thick CMT monoliths is eliminated. The use of full thickness CMT die enables industry standard pick and place tools to be utilised.

The use of a full thickness CMT die enables smaller pitch and larger area focal plane arrays to be realised than is possible with monoliths fabricated in LPE layers, as the device fabrication procedure described above does not require the fabrication of thin monoliths. This also has the effect of reducing yield losses due to mechanical breakage.

The alternative form of the device depicted in FIG. 2 is manufactured using the following process steps:

1. MOVPE growth of the structure shown in FIG. 2.
2. Formation of an array of cone shaped pseudo-loophole diodes in the wafer by a combination of photolithography and ion beam milling and contact metal deposition. The cone shaped profile is a natural consequence of the ion beam milling process
3. Dice the CMT wafer into individual die.
4. Bond the CMT die onto a ROIC die, the latter having an array of metal contacts formed onto it of dimensions and location designed to fit into the pattern of pseudo-loopholes.
5. In-fill the gap between the ROIC and CMT die with an adhesive component (optional).
6. Remove the growth substrate by selective etching.

This form of the invention has the following additional advantages:

1. The thickness of the hetero-passivation can be selected such that the bottom of the pseudo-loophole cone just protrudes into the active absorber layer where the type converted photodiode is formed. This maximises the process tolerances for the pseudo-loophole photolithography and junction formation processes. Because of the cone shaped pseudo-loophole profile, a higher density of photodiodes can be achieved with larger windows in the photo-resist layer used to define the photodiode array.
2. The cone-shaped pseudo-loopholes aid self-alignment of the metal contact pattern on the ROIC during bump-bonding.
3. The cone shape also helps to confine the metal reducing the risk of electrical shorts between neighbouring diodes for small pitches.
4. The absorber thickness can be increased to maximise the quantum efficiency without compromising electrical connectivity of the photodiode to the ROIC.
5. The junction depth can be positioned at the bottom of the absorber by a suitable choice of milling conditions, dopant and x-profiles which will help to reduce cross-talk.
6. Alternatively, the junction can be positioned at the interface between the absorber and the hetero-passivation to minimise leakage currents.
7. The dopant profile in the buffer layer can be engineered to have a low series resistance and hence minimise debiasing in large arrays; i.e. it minimises the variation in diode bias that arises from the voltage drop in the common layer.

The invention claimed is:

1. A method of producing an infrared detector comprising:
    forming a cadmium mercury telluride (CMT) wafer that includes active device layers having an absorber layer that is sandwiched between two layers with higher x(Cd) that will passivate a diode pn junction where it reaches a surface of a CMT heterostructure;
    forming a buffer layer on a substrate, the buffer layer ensuring the absorber layer does not contain dislocations produced by a lattice mismatch between the CMT heterostructure and the substrate;
    forming a spacer layer on the buffer layer to space the active device layers from the buffer layer;
    forming an etch stop layer on the spacer layer and directly adjacent to the active device layers;
    dicing the CMT wafer into an individual CMT die;
    bonding the CMT die to an integrated circuit wafer, wherein the active device layers have a uniform thickness;
    selectively etching remaining material of the substrate and remaining material of the buffer layer of the CMT die;
    forming a loophole focal plane array having a plurality of diodes in CMT monoliths of the active device layers on the integrated circuit wafer; and
    dicing the integrated circuit wafer (IC) into an individual IC die following formation of the loophole focal plane array.

2. The method of producing an infra red detector according to claim 1 comprising:
    b) bonding the CMT die of the CMT wafer to desired tested sites on readout integrated circuit (ROIC) wafer; and
    c) removing the remaining material of the substrate and the remaining material of the buffer layer by selective or non-selective etching to form the CMT monoliths.

3. The method according to claim 2 wherein forming the loophole focal plane array comprises:
    forming the array of loophole diodes in the CMT monoliths by ion beam milling through a photo-resist mask and depositing metal through the same mask to form contacts; and
    b) dicing said ROIC wafer into individual dies.

4. The method of producing an infra red detector according claim 1, comprising:
    a) bonding the CMT die to tested good sites on an ROIC wafer; and
    b) removing the remaining material of the substrate and the remaining material of the buffer layer by selective or non-selective etching to form monoliths.

5. The method according to claim 1, wherein forming the loophole focal plane array comprises:
    forming the array of loophole diodes in the CMT monoliths by ion beam milling through a photo-resist mask and depositing metal through the same mask to form contacts.

6. The method of producing an infrared detector according to claim 2, wherein forming the loophole focal plane array comprises:
    a) forming arrays of pseudo-loophole diodes in the CMT wafer by ion beam milling through a photo-resist mask, and depositing metal through the same photo-resist mask to form contacts;
    b) dicing the CMT wafer into individual arrays;
    c) bump-bonding said individual arrays to ROICS; and
    d) removing the remaining material of the substrate from the arrays by etching.

7. The method of producing an infrared detector according to claim 3, wherein forming the loophole focal plane array comprises:
    a) forming arrays of pseudo-loophole diodes in the CMT wafer by ion beam milling through a photo-resist mask, and depositing metal through the same photo-resist mask to form contacts;
    b) dicing the CMT wafer into individual arrays;
    c) bump-bonding said individual arrays to ROICS; and
    d) removing the remaining material of the substrate from the arrays by etching.

8. The method of producing an infrared detector according to claim 1, wherein forming the loophole focal plane array comprises:

a) forming arrays of pseudo-loophole diodes in the CMT wafer by ion beam milling through a photo-resist mask, and depositing metal through the same photo-resist mask to form contacts;
b) dicing the CMT wafer into individual arrays;
c) bump-bonding said individual arrays to ROICS; and
c) removing the remaining material of the substrate from the arrays by etching.

* * * * *